(12) United States Patent
Katoch et al.

(10) Patent No.: US 7,429,885 B2
(45) Date of Patent: Sep. 30, 2008

(54) CLAMPING CIRCUIT TO COUNTER PARASITIC COUPLING

(75) Inventors: Atul Katoch, Eindhoven (NL); Rinze Ida Mechtildis Peter Meijer, Eindhoven (NL); Sanjeev Kimar Jain, Delhi (IN)

(73) Assignee: Koninklijke Philips Electronics N.V., Eindhoven (NL)

( * ) Notice: Subject to any disclaimer, the term of this patent is extended or adjusted under 35 U.S.C. 154(b) by 240 days.

(21) Appl. No.: 10/556,113

(22) PCT Filed: Aug. 7, 2004

(86) PCT No.: PCT/IB2004/050616

§ 371 (c)(1),
(2), (4) Date: Nov. 8, 2005

(87) PCT Pub. No.: WO2004/100377

PCT Pub. Date: Nov. 18, 2004

(65) Prior Publication Data

US 2007/0013429 A1 Jan. 18, 2007

(30) Foreign Application Priority Data

May 12, 2003 (EP) .................................. 03101313

(51) Int. Cl.
*H03K 5/08* (2006.01)
*H03L 5/00* (2006.01)

(52) U.S. Cl. ........................................ 327/309; 327/321
(58) Field of Classification Search ................. 327/306, 327/309–311, 317–321
See application file for complete search history.

(56) References Cited

U.S. PATENT DOCUMENTS

| | | | | | |
|---|---|---|---|---|---|
| 5,680,366 | A | * | 10/1997 | Kotani et al. | 365/230.06 |
| 5,684,429 | A | * | 11/1997 | Sanwo et al. | 327/563 |
| 5,920,223 | A | * | 7/1999 | Johnson | 327/309 |
| 6,515,345 | B2 | * | 2/2003 | Robb et al. | 257/551 |
| 7,057,475 | B2 | * | 6/2006 | Gottlieb et al. | 333/181 |
| 7,058,263 | B2 | * | 6/2006 | Welch et al. | 385/37 |

* cited by examiner

*Primary Examiner*—Dinh T. Le

(57) ABSTRACT

A clamper circuit for receiving an input signal from a victim wire, the clamper circuit being capable of receiving aggressor signals from aggressor wires, the aggressor wires being the signal wires that can potentially induce crosstalk on the victim wire and an output signal being selectively enabled based on the logic states of the input signal and the aggressor signals, the clamper circuit also being capable of accelerating the switching of the victim wire when an opposite transition occurs on the aggressors and victim wire at the same time, so as to thereby reduce worst case delay and improve the signal integrity.

19 Claims, 5 Drawing Sheets

CLAMPING CIRCUIT TO COUNTER PARASITIC COUPLING

FIELD OF INVENTION

The invention relates to a clamper circuit, and in particular, to a clamper circuit for a signal wire on an integrated circuit, such as a signal wire of an on-chip bus.

BACKGROUND

As integrated circuit technology is scaled to provide increase chip, the on-chip interconnects become narrower and narrower. In addition, the height of the on-chip interconnects tend not to be scaled linearly with the width of the interconnects, thus making their aspect ratios larger. These trends lead to an increase in coupling capacitance with neighboring wires, which in turn leads to increased crosstalk between wires. Maintaining the signal integrity of a communication bus can therefore be problematic because of these degrading effects.

It is known to use repeater circuits for improving signal, integrity. However, the use of repeater circuits alone does not provide a solution to the problems mentioned above, since glitches can still occur at the receiving end of a wire, which can result in logic faults and higher power dissipation.

SUMMARY OF PRESENT DISCLOSURE

An object of the present invention is to provide a clamper circuit for a signal wire on an integrated circuit, for example the signal wire of an on-chip bus, which helps to alleviate the disadvantages mentioned above.

According to a first aspect of the present invention, there is provided a clamper circuit for a signal wire of an integrated circuit, the clamper circuit comprising:
  an input connection for receiving an input signal corresponding to a signal on the signal wire;
  an output connection for providing an output signal for clamping the signal on the signal wire;

characterized in that the circuit comprises means for receiving one or more aggressor signals, and means for selectively enabling the output signal in accordance with the status of the input signal and one or more of the aggressor signals.

According to a second aspect of the present invention, there is provided a method of clamping a signal on a signal wire of an integrated circuit, the method comprising the steps of:
  receiving an input signal corresponding to the signal on the signal wire;
  providing an output signal for clamping the signal on the signal wire; characterized by the step of selectively enabling the output signal in accordance with the status of the input signal and one or more aggressor signals.

According to another aspect of the present invention, there is provided an integrated circuit having one or more clamper circuits as defined in the claims.

Advantageous embodiments are defined by the dependant claims.

BRIEF DESCRIPTION OF THE DRAWINGS

For a better understanding of the present invention, and to show more clearly how it may be carried into effect, reference will now be made, by way of example, to the accompanying drawings, in which.

DETAILED DESCRIPTION

Figure 1:
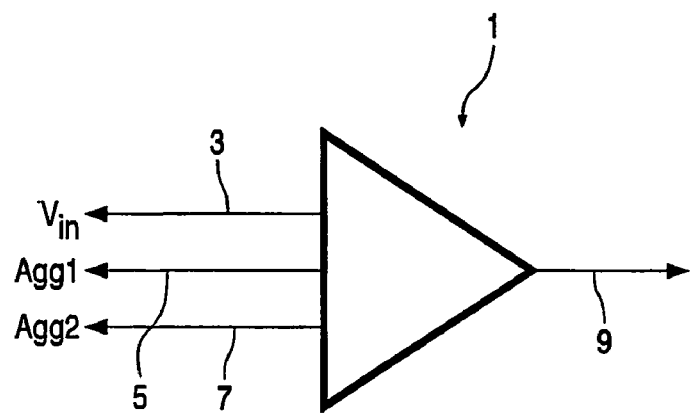
FIG. 1 shows a block diagram of a clamper circuit according to the present invention.

FIG. 1 shows a block diagram of a clamper circuit 1 according to the present invention. The clamper circuit receives an input signal 3 (Vin) from the signal wire being clamped, i.e. the victim wire. The clamper circuit 1 also receives aggressor signals 5, 7 from aggressor wires, the aggressor wires being the signal wires that can potentially induce crosstalk on the victim wire. An output signal 9, for clamping the victim wire, is selectively enabled based on the logic states of the input signal 3 and the aggressor signals 5, 7.

Unlike a traditional repeater circuit which is placed in the path of the wire under consideration, the clamper circuit 1 is instead connected to the victim wire such that the input signal 3 and output signal 9 are connected to the same point on the wire under consideration.

The aggressor signals 5, 7 are preferably taken from the immediate aggressors of the victim wire, for example the immediate neighbors on an on-chip bus. However, it will be appreciated that the aggressor signals 5, 7 may also be taken from other signal wires which have a degrading effect on the signal wire under consideration. For example, the aggressor signals can be taken from wires other than the immediate neighbors, or from signal wires on a metal plane which is above or below the plane of the signal wire.

Figure 2:
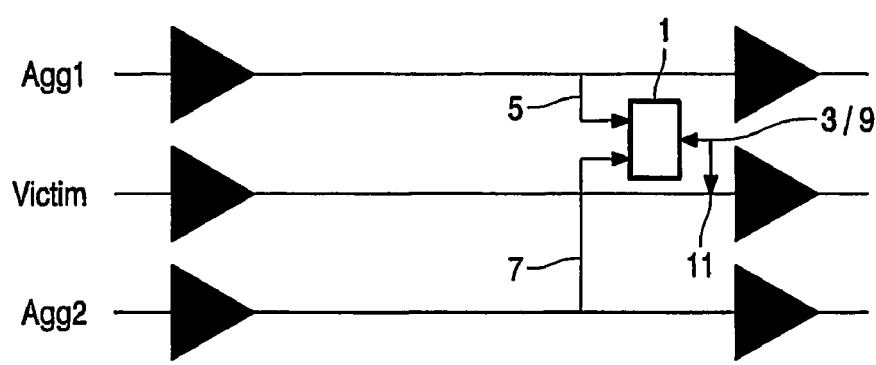
FIG. 2 shows how the clamper circuit may be used with a signal wire of an on-chip bus.

FIG. 2 shows the placement of the clamper circuit 1 in a bus system, for example an on-chip bus. The clamper circuit 1 receives first and second aggressor signals 5, 7 from the immediate neighbors of the victim wire. In addition, the clamper circuit is arranged such that the input signal 3 and output signal 9 are connected to the same point 11 on the victim wire.

Preferably, the clamper circuit is positioned near the receiving end of the signal wire under consideration, where the maximum crosstalk noise (or peak noise voltage) occurs. The clamper circuit 1 has the advantage of helping the driver on the victim wire to discharge the induced charge at a faster rate, leading to a lower value of peak crosstalk noise.

Preferably, the clamper circuit I is placed at the end of every wire section in the parallel repeater insertion and staggered repeater insertion methods.

The clamper circuit 1 has the advantage of accelerating the switching of the victim wire when an opposite transition occurs on the aggressors and victim wire at the same time, as will be described in greater detail later in the application. Therefore, the clamper circuit reduces worst-case delay and improves the signal integrity. At the same time, although the clamper circuit increases the typical case delay, this does not affect the maximum communication speed of an on-chip bus, provided that the typical case delay is less than the worst-case delay.

Figure 3:
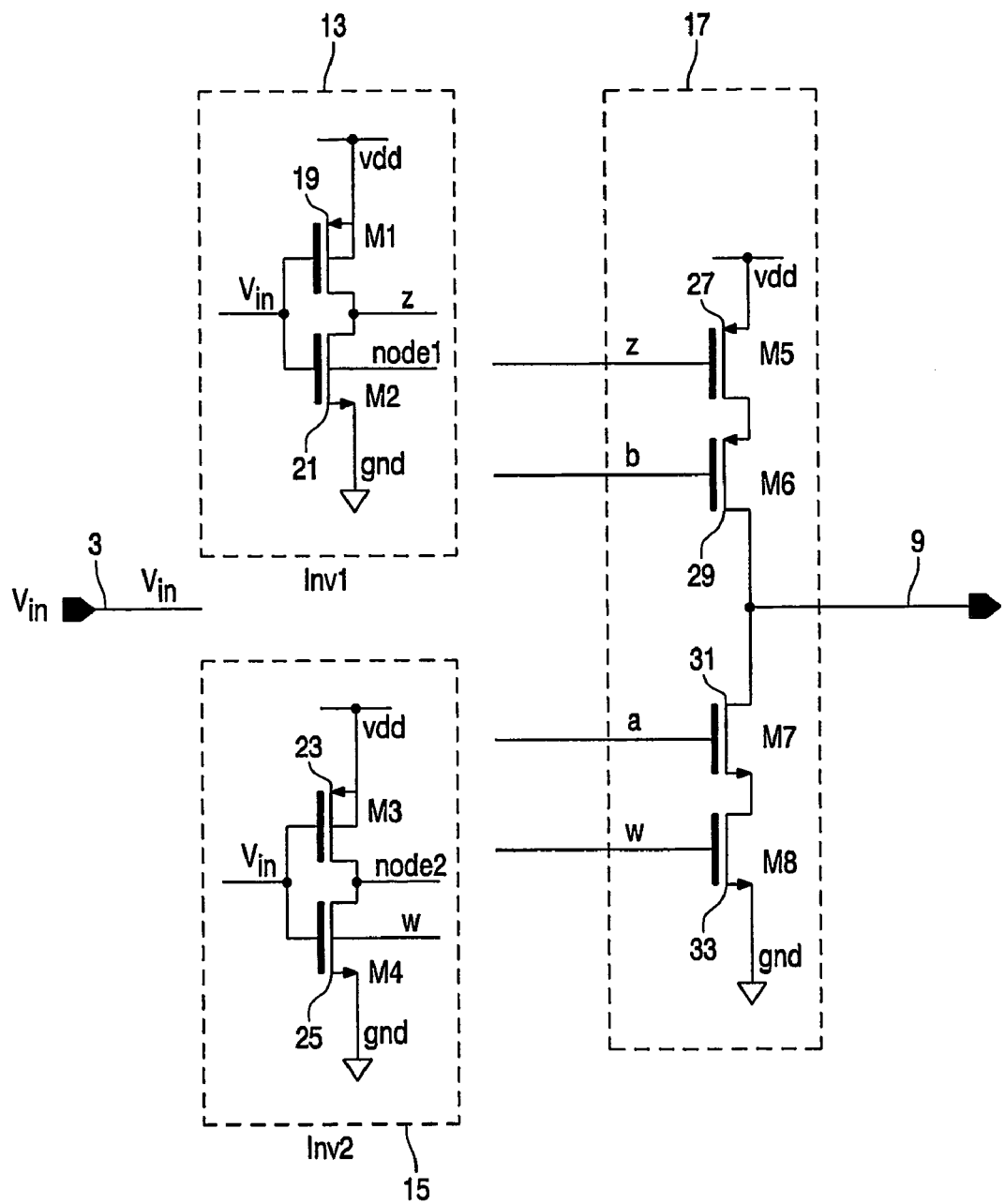
FIG. 3 shows further details of a clamper circuit according to an embodiment of the present invention.

FIG. 3 shows further details of the clamper circuit according to a preferred embodiment of the present invention. The clamper circuit 1 receives an input signal 3 from the signal wire to be clamped, and produces an output signal 9 for clamping the signal wire.

The clamper circuit 1 comprises an inverting circuit and a clamping stage 17. Preferably, the inverting circuit comprises first and second inverting stages 13, 15. The inverting stages 13, 15 are designed for low and high switching threshold respectively. The first inverting stage 13 comprises a PMOS transistor 19 (M1) and an NMOS transistor 21 (M2). The source of the PMOS transistor 19 is connected to the supply voltage Vdd, while the drain is connected to the drain of the NMOS transistor 21. The Bulk-source of transistor 19 (M1) are shorted together. The gates of the PMOS and NMOS transistors 19, 21 are connected together, and receive the input signal 3 corresponding to the voltage Vin of the signal wire under consideration. The drain connections of transistors 19, 21 are connected to the gate of a PMOS transistor 27 (M5) in a pull up path of the clamping stage 17. The source of NMOS transistor 21 is connected to ground.

Similar to the above, the second inverting stage 15 comprises a PMOS transistor 23 (M3) and an NMOS transistor 25 (M4). The source of the PMOS transistor 23 is connected to the supply voltage Vdd, while the drain is connected to the drain of the NMOS transistor 25. The Bulk-source of the transistor 25 (M4) are shorted. The gates of the PMOS and NMOS transistors 23, 25 are connected together, and receive the input signal 3 corresponding to the voltage Vin of the signal wire under consideration. The drain connections of transistors 23, 25 are connected to the gate of an NMOS transistor 33 (M8) in a pull down path of the clamping stage 17. The source of NMOS transistor 25 is connected to ground.

The low and high switching thresholds of the first and second inverting stages 13, 15 are chosen according to the maximum crosstalk peak that is observed on a particular section of wire. For example, the low and high thresholds are typically 400 mV and 700 mV respectively. This means that the inverting stages 13 (having a low switching threshold) and 15 (having a high switching threshold) will not switch due to crosstalk when the aggressor signals switch.

The clamping stage 17 comprises a pull up path comprising PMOS transistors 27, 29 and a pull down path comprising NMOS transistors 31, 33. The pmos transistor 27 (M5) has a source connected to Vdd and a drain connected to the PMOS transistor 29 (M6). As mentioned above, the gate of PMOS transistor 27 is connected to the drain connections of the transistors 19, 21 in the first inverting stage 13. The gate of PMOS transistor 29 receives a control signal "b". The drain of PMOS transistor 29 is connected to the drain of the NMOS transistor 31 (M7) in the pull down path, and also provides the output signal 9 of the clamper circuit 1. The source of NMOS transistor 31 is connected to the drain of NMOS transistor 33 (M8). The source of NMOS transistor 33 is connected to ground, while the gate of NMOS transistor 33 is connected to the drain connections of the transistors 23, 25 in the second inverter stage 15. The gate of NMOS transistor 31 receives a second control signal "a".

The control signals a and b are determined by the logic states of the aggressor and victim wires as shown in Table 1 below, where X represents "don't care" states, and Agg1 and Agg2 represent the first and second aggressor signals 5, 7.

TABLE 1

Truth table for control signals a and b

| Vin | Agg1 | Agg2 | a | b |
|---|---|---|---|---|
| 0 | 0 | 0 | 1 | 1 |
| 0 | 1 | 1 | 0 | 0 |
| 1 | 1 | 1 | 0 | 0 |
| 1 | 0 | 0 | 1 | 1 |
| X | 0 | 1 | 0 | 1 |
| X | 1 | 0 | 0 | 1 |

The logical functions of signals a and b are represented by equations (1) and (2) below:

$$a = \overline{Agg1 + Agg2} \qquad (1)$$

$$b = \overline{Agg1 \cdot Agg2} \qquad (2)$$

The logic selection circuits used to represent these logical functions are implemented in such a way that their delay meets the criterion shown in equation (3), where $T_{CLK}$ is the clock period, $T_{SL}$ is the delay of the logic selection circuit and $\tau_{max}$ is the switching time of the aggressors at the end of each wire section.

$$T_{CLK} > T_{SL} > \tau_{max} \qquad (3)$$

It can be seen from equations (1) and (2) above that the logical functions correspond to NOR and NAND gates, respectively. Thus, the selection logic for deriving the "a" and "b" control signals from the aggressor signals 5, 7 can be obtained as shown in FIG. 4.

Figure 4:
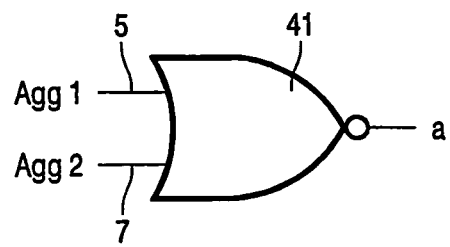
FIG. 4 shows a selection circuit for the clamper circuit of FIG. 3.
Figure 4:
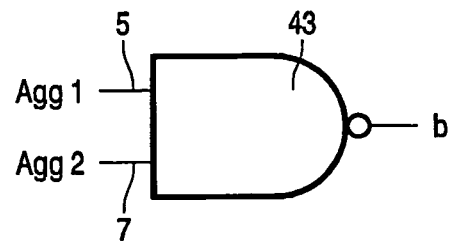

FIG. 4 shows how the control signal "a" is derived using a NOR gate 41, having a first input corresponding to the first aggressor signal 5, and a second input corresponding to the second aggressor signal 7. The control signal "b" is derived using a NAND gate 43 having a first input corresponding to the first aggressor signal 5, and a second input corresponding to the second aggressor signal 7.

Next, a more detailed explanation of the operation of the embodiment of FIG. 3 will be given. Crosstalk noise, which can cause a glitch at the receiver, occurs when the aggressors and the victim wire are in the same state. Let us assume that the aggressors and the victim wire are at logic 0. In this state, the control signals "a" and "b" are at logic 1. Therefore, the pull down path in the clamping stage 17 is enabled as both the transistors 31 (M7) and 33 (M8) are turned on. Now, if the aggressor signals 5, 7 switch from logic 0 to logic 1 and the victim wire remains at logic 0, the pull down path 31, 33 discharges the induced charge at the end of the section of the respective victim wire. Therefore, the peak crosstalk noise is reduced at the cost of a higher typical case delay.

The reason for a higher typical case delay can be explained as follows. Assume that the aggressors and the victim wire are at logic 0. The selection signals "a" and "b" are at logic 1 which enables the pull down path 31, 33 of the clamping stage 17. Now, if the victim wire switches from logic 0 to logic 1 and the aggressors remain quiet, the selection signals "a" and "b" remain at the same logic 1. The clamping stage 17 will be enabled until the victim wire voltage crosses the switching threshold voltage of the second inverter stage 15. After the voltage of the victim wire crosses the threshold of the second inverter stage 15, the clamping circuit is disabled. Therefore, the typical case delay is increased due to the delay introduced by the second inverter stage 15 and the fight between the clamping circuit and driver on the victim wire.

The clamper circuit of the present invention improves the worst-case delay, which can be explained as follows. Let us assume that the aggressors are at logic 1 and the victim wire is at logic 0. The selection signals "a" and "b" are at logic 0 in these states. The transistor 29 (M6) in the pull up path of the clamping stage 17 is enabled. The pull down path 31, 33 is not enabled in these states. Now the aggressors switch from logic 1 to logic 0 and the victim wire switches from logic 0 to logic 1. The selection signals "a" and "b" remain at logic 0 during the switching of the aggressors. The pull up path 27, 29 is enabled and thus accelerates the switching of the victim wire and the worst-case delay is decreased.

Figure 5:
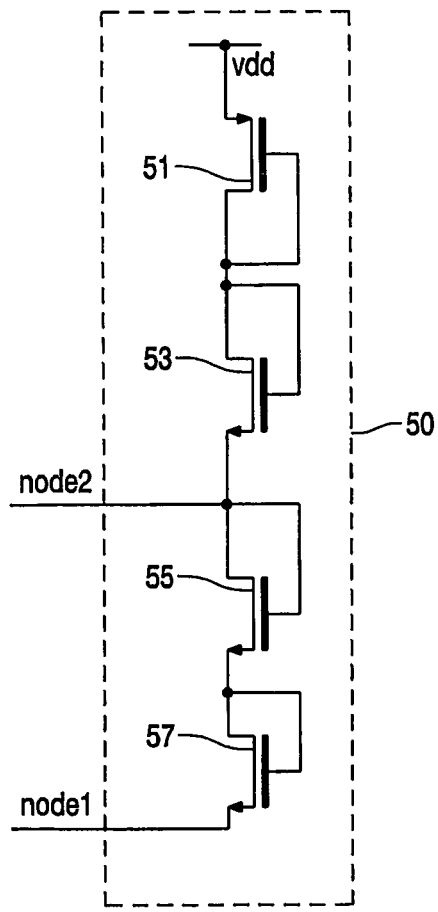
FIG. 5 shows a bias circuit for the clamper circuit of FIG. 3.

Preferably, the clamper circuit of FIG. 3 uses triple well technology for enabling the threshold voltages of the first and second inverter stages 13, 15 to be lowered. FIG. 5 shows a local bias circuit 50 for biasing the first and second inverter stages when triple well technology is used. The bias circuit 50 provides the bias signals "node 1" and "node 2" for the transistors 21 and 23 in the first and second inverter stages 13, 15, respectively. The bias circuit 50 comprises a first PMOS transistor 51 and NMOS transistors 53, 55 and 57. The source of PMOS transistor 51 is connected to Vdd, while the gate and drain are shorted together, and connected to the drain of NMOS transistor 53. The drain of NMOS transistor 53 is shorted to its gate, and the source of NMOS 53 is connected to the drain of NMOS transistor 55. The drain of NMOS transistor 55 is connected to its gate, and also connected as the bias voltage "node 1" for NMOS transistor 21 in FIG. 3. The source of NMOS transistor 55 is connected to the drain of NMOS transistor 57. The drain of NMOS transistor 57 is shorted to its gate, and the source provides the bias voltage "node 2" for PMOS transistor 23 in FIG. 3.

The biasing circuit is used to lower the threshold voltage of the pull up transistor 21 in the first inverter stage 13 and the pull down voltage of the transistor 23 in the second inverting stage 15, thus enabling the switching thresholds to be lowered. It will be appreciated by a person skilled in the art that other biasing circuits can also be used for providing this function. In addition, or alternatively, the thresholds can also be lowered using transistor sizing.

Preferably, the sizes of the transistors are chosen to be the minimum dimensions allowed by the technology, as they have to bias very small wells.

Figure 6:
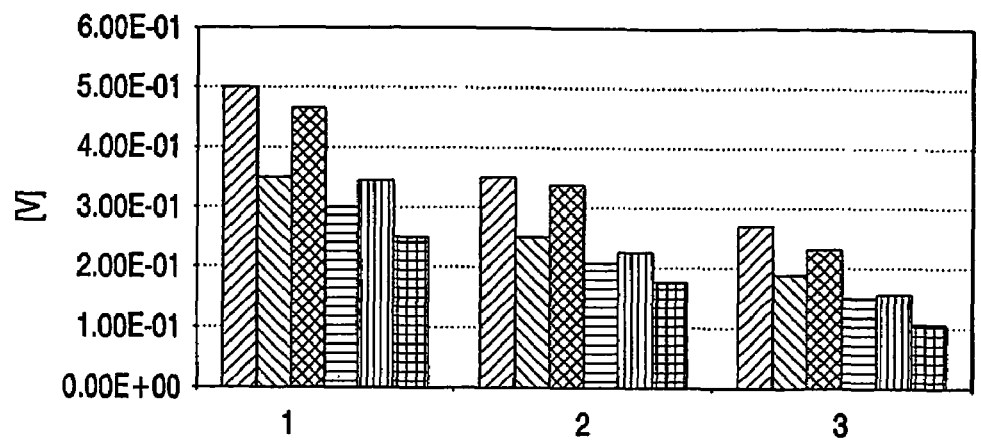
FIG. 6 shows simulation results for peak crosstalk versus wire spacing for different schemes at minimum wire width.
Figure 7:
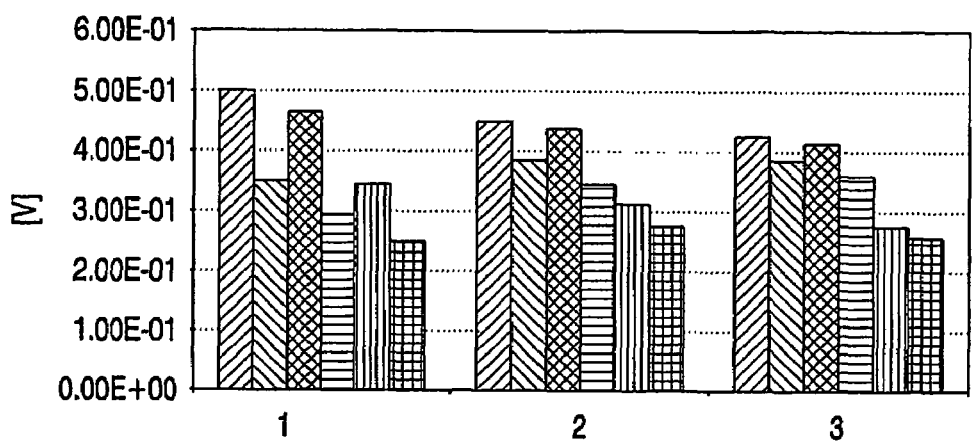
FIG. 7 shows simulation results for peak crosstalk versus wire width for different schemes at minimum wire spacing.

FIGS. 6 and 7 show the results of simulations that have been performed for different wire configurations at a fixed wire length of 10 mm in 0.13 μm for wires on Metal 2 over Metal 1 planes.

With respect to FIGS. 6 and 7, the following illustrates the key to the graphs:

▨No Repeaters

▧Aggressor aware clamper with no repeaters

▤Parallel repeater insertion (3-3-2-2 mm)

▥Parallel repeater insertion with a or aware clamper (3-3-2-2 mm)

▦Staggered repeater insertion (3-3-2-2 mm)

▩Staggered repeater insertion with aggressor aware clamper (3-3-2-2 mm)

FIG. 6 shows the peak crosstalk noise for different wire spacing (in multiples of minimum spacing) at minimum wire width. FIG. 7 shows the peak crosstalk noise for different wire width (in multiples of minimum wire width) at minimum wire spacing. It can be seen that the clamper circuit of the invention, referred to as the "aggressor aware clamper", decreases the peak crosstalk noise by about 30% in case of no repeaters and about 26% in the case of staggered repeater insertion (3-3-2-2 mm) at minimum wire pitch as has been shown in FIG. 6. It decreases the peak crosstalk noise by about 39.5% in case of the parallel repeater insertion (3-3-2-2 mm) at minimum wire pitch as has been shown in FIG. 6. Tables 2 and 3 show the improvement of the worst-case delay and the worst-case energy delay product at minimum wire pitch.

TABLE 2

Worst case delay [ns] for different schemes at minimum wire pitch

| | Worst case delay [ns] | | |
|---|---|---|---|
| Schemes | No aggressor aware clamper | Aggressor aware clamper | Percentage improvement [%] |
| No repeater | 7.39 | 6.36 | 13.9 |
| Parallel repeater insertion (3-3-2-2 mm) | 2.41 | 2.23 | 7.4 |
| Staggered repeater insertion (3-3-2-2 mm) | 1.93 | 1.80 | 6.7 |

TABLE 3

Worst case delay product [mW*ns$^2$] for different schemes at minimum wire pitch

| | Energy delay product [mW*ns$^2$] | | |
|---|---|---|---|
| Schemes | No aggressor aware clamper | Aggressor aware clamper | Percentage improvement [%] |
| No repeater | 13.4 | 12.1 | 9.9 |
| Parallel repeater insertion (3-3-2-2 mm) | 0.220 | 0.203 | 7.5 |
| Staggered repeater insertion (3-3-2-2 mm) | 0.117 | 0.115 | 1.3 |

Table 4 shows the delay noise for the different schemes at minimum wire pitch. The aggressor aware clamper reduces the delay noise significantly for parallel and staggered repeater insertion at a minimum wire pitch.

TABLE 4

Delay noise [ns] for different schemes at minimum wire pitch

| | Delay noise [ns] | | |
|---|---|---|---|
| Schemes | No aggressor aware clamper | Aggressor aware clamper | Percentage improvement [%] |
| No repeater | 5.95 | 4.9 | 17.6 |
| Parallel repeater insertion (3-3-2-2 mm) | 1.38 | 1.00 | 27.2 |
| Staggered repeater insertion (3-3-2-2 mm) | 0.38 | 0.13 | 65.8 |

TABLE 5

Higher order crosstalk noise voltage [V] for aggressor aware clamper with various schemes at minimum wire pitch

| | Xtalk noise | | | | | | | | | | | |
|---|---|---|---|---|---|---|---|---|---|---|---|---|
| | No repeaters | | | | Parallel repeater insertion (3-3-2-2 mm) | | | | Staggered repeater insertion (3-3-2-2 mm) | | | |
| | No aggressor aware clamper | | Aggressor aware clamper | | No aggressor aware clamper | | Aggressor aware clamper | | No aggressor aware clamper | | Aggressor aware clamper | |
| order | Peak noise | Glitch | Peak noise | Glitch | Peak noise | Glitch | Peak noise | Glitch | Peak noise | Glitch | Peak noise | Glitch |
| 1st order | 0.499 | — | 0.349 | — | 0.488 | — | 0.295 | — | 0.343 | — | 0.251 | — |
| 2nd order | 0.651 | — | 0.473 | — | 0.668 | Yes (not full Vdd) | 0.418 | — | 0.436 | — | 0.338 | — |
| 3rd order | 0.696 | — | 0.515 | — | 0.680 | Yes (full Vdd) | 0.402 | — | 0.457 | — | 0.347 | — |
| 4th order | 0.708 | — | 0.529 | — | 0.687 | Yes (full Vdd) | 0.407 | — | 0.459 | — | 0.354 | — |

Table 5 shows crosstalk noise for higher order crosstalk cases for the aggressor aware clamper at minimum wire pitch. Here, the switching of more than two immediate aggressors is referred to as higher order crosstalk.

Figure 8:
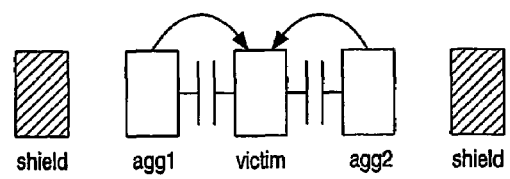
FIG. 8 shows first order crosstalk.
Figure 9:
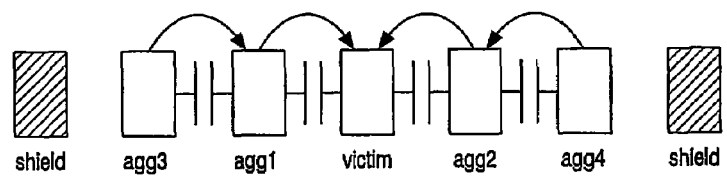
FIG. 9 shows second order crosstalk.
Figure 10:
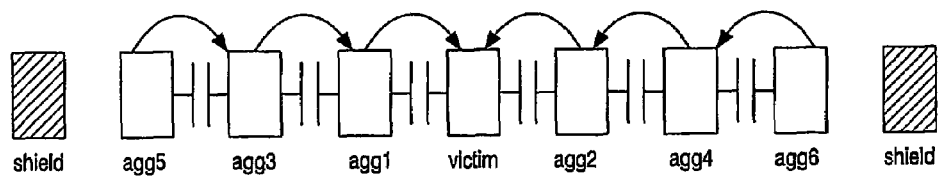
FIG. 10 shows third order crosstalk.

FIGS. 8 to 10 show what is meant by first, second and third order crosstalk. First order crosstalk relates to crosstalk induced by the immediate neighbors of a victim wire, as shown in FIG. 8. Second order crosstalk, as shown in FIG. 9, relates to crosstalk induced by simultaneous switching of two aggressor wires on either side of the victim wire, while third order crosstalk, as shown in FIG. 10, relates to crosstalk induced by simultaneous switching of three aggressor wires on either side of the victim wire. Thus, $n^{th}$ order crosstalk means, simultaneous switching of n neighbors on the either side of the victim wire on the bus. If signals from multiple aggressors are used, then the states which form the initial condition for worst-case crosstalk are identified, and used to generate a truth table similar to the one shown in Table 1 above. The clamping circuit is then controlled by logic selection signals according to the logic states defined by such a truth table.

It is clear from the Table 5 that the clamper circuit of the invention is particularly effective in preventing glitches at the output of the receivers, especially in the case of parallel repeater insertion. Table 5 shows two sub columns named as "Teak Noise" and "glitch". The sub column "Teak Noise" indicates the peak crosstalk noise at the end of the wire sections. For cases when there is a glitch at the output, then the sub-column "peak noise" refers to the peak crosstalk noise observed at the end of the first wire section. For the third and the fourth order crosstalk, a glitch always occurs (highlighted) at the end of each wire section on the victim wire in the case of parallel repeater insertion (3-3-2-2 mm). This glitch appears only for a short duration and induces extra charge on the victim wire. This extra charge and the charge induced by the aggressors cause an increase in the peak crosstalk noise.

In the examples described above, the clamper is used to accelerate the switching of the victim wire in worst-case delay situations, i.e. when an opposite transition occurs on the aggressors and victim wire at the same time.

According to another aspect of the invention, when reliability is an issue, the clamping circuit can be used to clamp the victim wire when overshoots and undershoots occur on the line. Although this results in a higher worst-case delay, it does provide greater signal integrity when reliability is an issue. This is achieved by changing the truth table of Table 1, and providing selection logic to control the clamping circuit in the required manner.

It is noted that, although the preferred embodiment makes use of first and second aggressor signals, it will be appreciated that the invention can also rely on just one aggressor signal, for example when the clamper circuit is used near the edge of an on-chip bus. Furthermore, the clamper circuit can also be used with more than two aggressor signals, for example when second or third order crosstalk is affecting signal integrity.

The invention described above therefore provides a clamper circuit that clamps a signal wire according to the state of one or more aggressor signal wires.

Furthermore, it is noted that although the preferred embodiment provides first and second inverting stages 13, 15, the invention can also be used where the thresholds are not changed, whereby the circuit becomes simplified in that the two inverting stages 13 and 15 merge into one inverting stage.

In the examples provided above, it will be readily apparent to a person skilled in the art that, although the preferred embodiments refer to the aggressor wires being the immediate neighbors of the victim wire, the aggressor wires could also be selected from other signal wires. For example, the aggressor wires need not be the immediate neighbors, or indeed from the same communication bus, as the victim wire. The aggressor wires can therefore be taken from any signal wires that have a significant impact on the victim wire, including neighbors from a metal plane lying above or below the victim wire. The invention can also be used with more than two aggressor wires, for example with two or three pairs of signal wires as described above in relation to second and third order crosstalk.

Furthermore, although the preferred embodiment shows the clamper circuit located near the end of a signal wire under consideration, the clamper circuit can also be located elsewhere on the signal wire.

The invention described above has the advantage of providing a clamper circuit which is used to clamp the signal level on a signal wire under consideration based on the logic states of two or more aggressor signals from other signal wires on the integrated circuit.

It should be noted that the above-mentioned embodiments illustrates rather than limits the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A clamper circuit for a signal wire of an integrated circuit, the clamper circuit comprising:
   an input connection for receiving an input signal corresponding to a signal on the signal wire;
   an output connection for providing an output signal, the output signal being provided for clamping the signal on the signal wire based on the input signal and control signals;
   one or more wires for receiving one or more aggressor signals; and
   means for forming the control signals based on the one or more of the aggressor signals to selectively enable the output signal.

2. A clamper circuit as claimed in claim 1, wherein the clamper circuit receives the one or more aggressor signals for selectively enabling the output signal.

3. A clamper circuit as claimed in claim 2, wherein the clamper circuit is adapted to provide an output signal when the input signal and the one or more aggressor signals are at the same logic level.

4. A clamper circuit as claimed in claim 3, wherein the clamper circuit is adapted to provide a pull down signal as the output signal when the input signal and the one or more aggressor signals are at logic 0.

5. A clamper circuit as claimed in claim 3, wherein the clamper circuit is adapted to provide a pull up signal as the output signal when the input signal and the one or more aggressor signals are at logic 1.

6. A clamper circuit as claimed in claim 3, wherein the output signal is enabled for a predetermined period of time, thereby discharging an induced charge on the signal wire if the one or more aggressor signals switch logic level while the signal wire remains at the same logic level.

7. A clamper circuit as claimed in claim 3, wherein the clamper circuit is adapted to disable the output signal in response to the input signal crossing a predetermined voltage threshold.

8. A clamper circuit as claimed in claim 2, having means for selectively providing a pull up or pull down path as the output signal in response to the input signal switching in an opposite direction to the one or more aggressor signals.

9. A clamper circuit as claimed in claim 1, further comprising:
   an inverting circuit for receiving the input signal; and
   a clamping stage for receiving the control signals and comprising a pull up path and a pull down path, the pull up and pull down paths being selectively enabled using the control signals.

10. A clamper circuit as claimed in claim 9, wherein the inverting circuit includes a first inverting stage having a low switching threshold; and a second inverting stage having a high switching threshold.

11. A clamper circuit as claimed in claim 9, wherein a first control signal (a) of the control signals is determined according to a status of the one or more aggressor signals such that $a = \overline{Agg1 + Agg2}$, where Agg1 is a first aggressor signal of the one or more aggressor signals and Agg2 is a second aggressor signal of the one or more aggressor signals.

12. A clamper circuit as claimed in claim 9, wherein a second control signal (b) of the control signals is set by a status of the one or more aggressor signals such that $b = \overline{\overline{Agg1} + \overline{Agg2}}$, where Agg1 is a first aggressor signal of the one or more aggressor signals and Agg2 is a second aggressor signal of the one or more aggressor signals.

13. A clamper circuit as claimed in claim 1, wherein the input connection and the output connection are connected to substantially the same point on the signal wire.

14. A clamper circuit as claimed in claim 13, wherein the input connection and the output connection are connected near a receiving end of the signal wire.

15. A clamper circuit as claimed in claim 1, wherein the one or more aggressor signals are provided by wires that have the most degrading impact on the signal wire.

16. A clamper circuit as claimed in claim 15, wherein the one or more aggressor signals are adjacent to the signal wire on a communication bus.

17. A clamper circuit (1) as claimed in claim 15, wherein the one or more aggressor signals are provided by wires on an integrated circuit that lie in a plane above or below the signal wire.

18. An integrated circuit comprising an on-chip communication bus having one or more clamper circuits as defined in claim 1.

19. A method of clamping a signal on a signal wire of an integrated circuit, the method comprising the steps of:
   receiving as an input signal the signal on the signal wire; and
   selectively providing an output signal for clamping the signal on the signal
   wire by selectively enabling a circuit in accordance with the input signal and control signals formed based on one or more aggressor signals from one or more wires.

* * * * *